United States Patent
Mikhemar et al.

(10) Patent No.: US 12,375,102 B2
(45) Date of Patent: Jul. 29, 2025

(54) HYBRID RATE INTERFACE TO REDUCE POWER CONSUMPTION AND AREA IN HIGH-SPEED DACs AND DIGITAL TRANSMITTERS

(71) Applicant: Avago Technologies International Sales Pte. Limited, Singapore (SG)

(72) Inventors: Mohyee Mikhemar, Aliso Viejo, CA (US); Alvin Lai Lin, Andover, MA (US); Andrew J. Blanksby, Lake Oswego, OR (US); Tirdad Sowlati, Irvine, CA (US); Arya Behzad, Los Altos, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 295 days.

(21) Appl. No.: 18/133,403

(22) Filed: Apr. 11, 2023

(65) Prior Publication Data

US 2024/0348262 A1 Oct. 17, 2024

(51) Int. Cl.
*H03M 1/66* (2006.01)
*H03M 1/00* (2006.01)
(Continued)

(52) U.S. Cl.
CPC ......... *H03M 7/4012* (2013.01); *H03M 1/002* (2013.01); *H03M 7/165* (2013.01)

(58) Field of Classification Search
CPC ........ H03M 1/687; H03M 1/747; H03M 1/68; H03M 1/682; H03M 1/66; H03M 1/0673; H03M 1/785; H03M 3/50; H03M 1/742; H03M 1/745; H03M 1/066; H03M 1/0863; H03M 1/1245; H03M 1/1033; H03M 1/1061; H03M 1/1071; H03M 1/125; H03M 3/358; H03M 3/384; H03M 9/00; H03M 3/504
(Continued)

(56) References Cited

U.S. PATENT DOCUMENTS 9,337,854 B1 * 5/2016 Chen ............... H03M 1/0673
9,577,657 B1 * 2/2017 Clara ................ H03M 1/109
(Continued)

OTHER PUBLICATIONS

European Search Report on non-Foley case related to U.S. Appl. No. 18/133,403 Dtd Sep. 18, 2024.
(Continued)

*Primary Examiner* — Linh V Nguyen
(74) *Attorney, Agent, or Firm* — Foley & Lardner LLP

(57) ABSTRACT

An system includes a port to receive a number of bits at a first frequency. One or more cells generate a signal for a channel with a channel frequency that is N times greater than the first frequency. The cells transmit at a second frequency that is M times greater than the first frequency but is smaller than the channel frequency. Interface links are coupled between a portion of the input bits of the port and the one or more cells and the portion of the input bits is encoded by thermometer coded T bits such that each one of the T bits is encoded by M repeated parallel bits having a value of a respective T bit. Each interface link includes M interface lines between each T bit and each first cell, and M is smaller than N to reduce the number of interface lines for the T bits.

20 Claims, 5 Drawing Sheets

(51) Int. Cl.
*H03M 7/16* (2006.01)
*H03M 7/40* (2006.01)

(58) Field of Classification Search
USPC .......................................... 341/144, 145, 61
See application file for complete search history.

(56) References Cited

U.S. PATENT DOCUMENTS

| | | | |
|---|---|---|---|
| 10,715,169 B1* | 7/2020 | Aouini | H03M 1/70 |
| 11,075,643 B2* | 7/2021 | Zhao | H03M 1/0656 |
| 2011/0122008 A1* | 5/2011 | Mahooti | H03M 1/069 |
| | | | 341/145 |
| 2016/0134302 A1* | 5/2016 | Schafferer | H03M 3/458 |
| | | | 341/120 |
| 2016/0308545 A1* | 10/2016 | Chandra | H03M 1/066 |
| 2019/0207565 A1* | 7/2019 | de Vreede | H04B 1/0483 |
| 2020/0028519 A1* | 1/2020 | Hsiao | H03M 1/067 |
| 2022/0200617 A1* | 6/2022 | Clara | H03M 1/1014 |
| 2023/0275596 A1* | 8/2023 | Engel | H03M 1/1004 |

OTHER PUBLICATIONS

Su Shiyu et al: "A 16-bit 12-GS/s Single-/Dual-Rate DAC With a Successive Bandpass Delta-Sigma Modulator Achieving <-67-dBc IM3 Within DC to 6-GHz Tunable Passbands", IEEE Journal of Solid-State Circuits, IEEE, USA, vol. 53, No. 12, Dec. 1, 2018 (Dec. 1, 2018), pp. 3517-3527, XP011701001, ISSN: 0018-9200, DOI: 10.1109/JSSC.2018.2871143 [retrieved on Dec. 18, 2018] * Section II; Section IV; figures 2(b), 9,11 *.

* cited by examiner

HYBRID RATE INTERFACE TO REDUCE POWER CONSUMPTION AND AREA IN HIGH-SPEED DACs AND DIGITAL TRANSMITTERS

TECHNICAL FIELD

The present description relates generally to digital to analog converters and, in particular, to an interface of high speed digital to analog converters.

BACKGROUND

High speed digital to analog converters and digital transmitters have large interfaces between digital input ports of the digital to analog converters to analog, radio frequency (RF) sections. The large interfaces take up large areas and consume large amounts of power. It is highly desirable to have smaller size interfaces, which consume less power.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
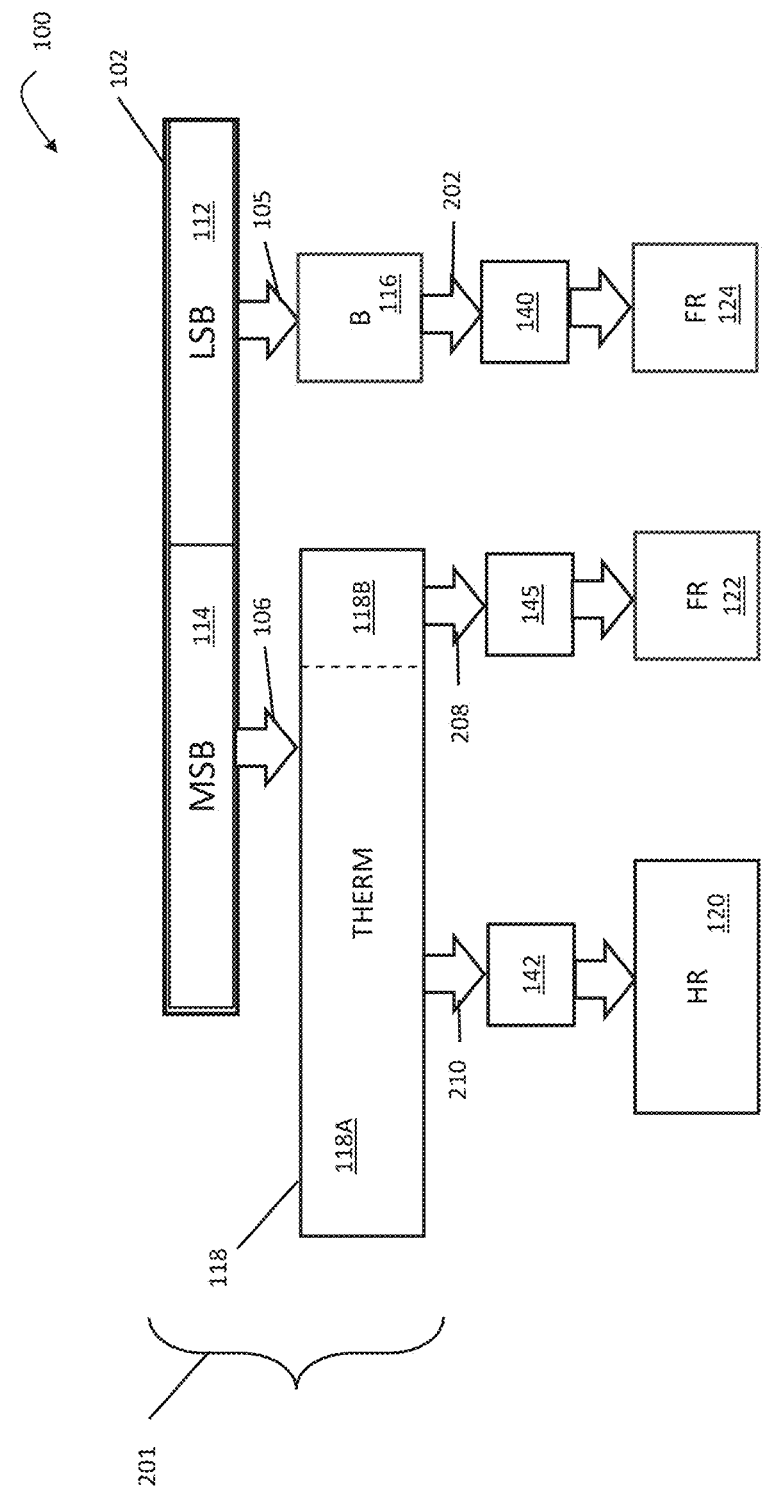
FIG. 1 illustrates a digital to analog converter, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

In a high speed digital to analog converter (DAC), the digital input section, including the input port of the DAC, that provides the digital signal, may run with a clock frequency of about a few hundred MHz to a few GHz, e.g., between about 200 MHz to 10 GHz, however, a speed of the analog section at an output port of the DAC may be N times greater, which N is an integer larger than one. Thus, the speed of the analog section may be around 16 GHz. In some embodiments, the DAC receives 13 bits of samples of a signal for conversion to an analog signal. Out of the 13 bits, the first 7 bits (bit zero to bit 6), e.g., the least significant bits (LSB) are toggling more frequently than the last 6 bits (bit number 7 to bit number 12), the most significant bits (MSB). In addition, the MSB have greater impact on the magnitude of the analog signal, e.g., greater effect of changing the magnitude of the analog signal compared to the LSB. Thus, the first 7 LSB are represented as binary bits. The 6 MSB may not change as fast as the LSB but the MSB have more effect on changing the signal and, thus, for the MSB thermometer coding is used to be less prone to error and noise, compared to the LSB. For example, for thermometer coding the 6 MSB, 64 bits are used. In the binary coded bits, a value of a bit changes by a power of two from one position to a next position, however, the value of a bit in binary coded bits are equal and each have a value that is twice the value of greatest binary bit.

In some embodiments, the thermometer code words using thermometer coding is used that have at most a single transition between the bits in each code word such that a code word is either entirely zeroes or entirely ones. If the code word is a mixture of zeroes and ones, there is only a single location that transitions between one and zero in the code word. As described, the speed of the analog section may be around 16 GHz. Thus, each bit is represented, e.g., repeated, into 16 bits of the same value and the 16 bits are transferred through 16 interface lines from the digital section to the analog section of the DAC, which are then serialized for transmission. As discussed, there are 71 bits for each input bit of the DAC, which are 7 binary bits and 64 thermometer bits, e.g., T bits, and each bit has 16 interface lines. Thus, there are a total of 1136 interface lines for each input bit of the DAC. This number is doubled if both in-phase and quadrature signals are used. Therefore, a lot of area, e.g., substrate area or silicon area, is used for producing the interface lines on the chip of the DAC and also a lot of power is used to transmit signals in the interface lines.

In the below paragraphs, methods and structures are proposed to reduce the number of interface lines and, thus, save area and save power. The thermometer coding used for MSB is less prone to error and noise compared to the LSB that used binary bits. In some embodiments, the T bits, or at least a subset of the T bits, change slower than the binary bits of the LSB and may be transmitted at a lower frequency. In some embodiments, each T bit is represented, e.g., repeated, by a number of bits that is smaller than 16. For example, a T bit is represented, e.g., encoded, by M repeated parallel bits of the same value with M an integer larger or equal to one, which is either 8 bits, 4 bits, 2 bits, or 1 bit. Thus, instead of 16 interface lines, M interface lines, between the M parallel bits and each DAC cell, e.g., each cell, is used. The M parallel interface lines respectively are either 8 interface lines, 4 interface lines, 2 interface lines, or one interface line, which saves area and power compared to area and power used for interface lines of the LSB binary bits. Thus, the T bits are transmitted at a speed of 8 GHz, 4 GHz, 2 GHz, or 1 GHz, respectively.

In some embodiments, a portion of the T bits that are toggling more frequent, e.g., comparable to the toggling frequency in the binary bit are transmitted at 16 GHz but the remaining T bis are transmitted at the lower speeds. In some embodiments, depending on how fast the T bits are changing, the T bits are divided into more than two portions and for example are divided into 4 portions. A first portion of the T bits are transmitted at 16 GHz, a second portion of the T bits are transmitted at 8 GHz, a third portion of the T bits are transmitted at 4 GHz, and fourth portion of the T bits are transmitted at 1 GHz and respectively, 16 interface lines, 8 interface lines, 4 interface lines, and one interface line is implemented.

In some embodiments, each DAC cell of a digital to analog converter provides two tasks and generates an analog signal to be transferred in the communication channel. In some embodiments, the channel frequency is higher than the frequency of the digital section and digital input bits of an input port of the digital to analog converter are generated with a digital-section frequency that is slower than the channel frequency. In some embodiments, each DAC cell is coupled to multiple parallel bits by parallel lines and receives multiple bits, e.g., receives N parallel bits at the same time, at the slower digital-section frequency. As a first task, each DAC includes a serializer, e.g., a serializer module, that stacks the N parallel bits one after the other generate a single serialized signal, which is N times faster than the digital-section frequency. In some embodiments, N is a ratio of the channel frequency to the digital-section frequency and, thus, the single serialized signal matches the channel frequency and is transmitted through the channel. As a second task, each DAC cell includes a signal-generator that provides a communication signal from the single serialized signal to be transferred in the communication channel that may be attached to each DAC cell.

In some embodiments, an interface link is provided between the digital input bits of the digital to analog converter and each DAC cell. Because each interface link includes N parallel interface lines, the DAC cell receive N parallel bits simultaneously. In some embodiments, each bit of the digital input bits of the digital to analog converter is connected, via a separate interface link, to only one DAC cell. Thus, for matching the digital-section frequency to the channel frequency, each bit is repeated N times at the input port of the digital to analog converter, or N consecutive data of each bit is stored at the input port of the digital to analog converter, and the N bits are sent to each DAC cell via the interface link that includes N interface lines. Therefore, the digital to analog converter includes a plurality of DAC cells such that each DAC cell has a one-to-one connection with each bit of the input port of the digital to analog converter. Each DAC cell is coupled through a separate interface link the digital to analog converter to only a respective bit of the input port of the digital to analog converter. In some embodiments, the digital-section that includes an input section of the interface system is limited in the frequency of data that provides for the interface system, e.g., the digital-section frequency is limited to 1 giga bits per second (Gbps) as the frequency of the digital bits that are provided. In some embodiments, an analog-section frequency is a few times, e.g., 16 times, greater than the frequency of the digital-section. Therefore, in some embodiments, parallelism is required to for transferring the bits from the input port to the DAC cell. In some embodiments, an analog transmitter, e.g., analog signal-generator, in of DAC cells does not receive parallel data and, thus, the parallel data of the interface lines are serialized before into one signal before being sent to the transmitter.

FIG. 1 illustrates an interface system 100 of a digital to analog converter, according to various aspects of the subject technology. FIG. 1 shows an input port 102, e.g., a DAC input port, having a plurality of bits e.g., input bits. The input bits of the input port 102 may be divided into two groups. A first group is most significant bits (MSB) in an MSB section, 114 of the input port 102. A second group is least significant bits (LSB) in an LSB section 112. In some embodiments, the input bits of the input port 102 are where a digital signal, e.g., multiple bits of a digital signal are delivered to the DAC. The input bits of the input port 102 are the combination of the bits in the MSB section and the bits in the LSB section. In some embodiments, a number of input bits of the input port 102 is between 8 and 48 bits. In some embodiments, a number of input bits of the input port 102 is either 12, 13, 16, or 24. In some embodiments, the number of input bits is 13, the MSB section has between 4 and 8 bits and the LSB section has between 5 and 9 bits. A value of the LSB section 112 is transmitted via an interface 105 into binary bits in a register 116. In some embodiments, because LSB section 112 also includes binary bits, the interface 105 is a direct mapping of the bits between the LSB section 112 and the register 116. As shown the bits in the MSB section 114 are transferred, via an interface 106 and using thermometer coding, into T bits in a register 118. In some embodiments, the LSB section 112 includes 7 bits and the register 116 also includes 7 bits. In some embodiments, the MSB section includes 6 bits and the register 118 includes T bits, e.g., 64 bits. In some embodiments, the interface 105 performs a two's complement in the mapping between the LSB section 112 and the register 116 to manage the negative values.

As shown in FIG. 1, a register 116 is coupled via an interface link 202, e.g., an interface line, to a DAC cell 140. As discussed, because the register 116 includes binary bits, each bit of the register 116 is represented by 16 parallel bits and the interface link 202 includes N parallel interface lines, e.g., N is 16. As shown, FIG. 1 also includes a digital input section 201 that includes the input port 102, the register 116 and the register 118. The register 118 includes a first portion of the T bits in a section 118A of the register 118 that are the T bits that are transmitted at lower frequencies of 8 GHz, 4 GHz, 2 GHz, or 1 GHz. The first portion of the T bits in the section 118A, respectively use M interface lines, e.g., 8 interface lines, 4 interface lines, 2 interface lines, or one interface line, in an interface link 210, between the register 118 and a DAC cell 142. A second portion of the T bits in a section 118B of the register 118 includes the T bits that are transmitted at the channel frequency of 16 GHz. Therefore, each interface link 208, e.g., interface lines of the interface link 208, that are coupled between each bit of the section 118B and a DAC cell 145 receives data from 16 repeated bits corresponding to the bit of the section 118B. The DAC cells 140, 142, and 145 generate respective waveforms for transmission. The DAC cells 140 and 145 generate a waveforms that are transmitted at a full rate, e.g., the channel frequency of 16 GHz via transmitters 122 and 124. The DAC cell 142 generates a waveform that is transmitted at a partial rate, e.g., 8 GHz, 4 GHz, 2 GHz, or 1 GHz. e.g., a half rate of 8 GHz, via a transmitter 120. Thus, for the DAC cell 140 or 145, each bit is represented, e.g., encoded, by N repeated parallel bits. For the DAC cell 142, each cell is represented, e.g., encoded, by M repeated parallel bits, where M is an integer larger or equal to one and smaller than N. In some embodiments, N is 16 and M is either 8, 4, 2, or 1. Therefore, for the T bits of section 118A, N over M times, e.g., 2, 4, 8, or 16 times, fewer number of interface lines is used compared to a number of interface lines for the T bits of section 118B or the binary bits of register 116. Also, for the T bits of section 118A, about N over M times, e.g., 2, 4, 8, or 16 times, smaller substrate area is used compared to a substrate area used for the T bits of section 118B or the binary bits of register 116.

Figure 2:
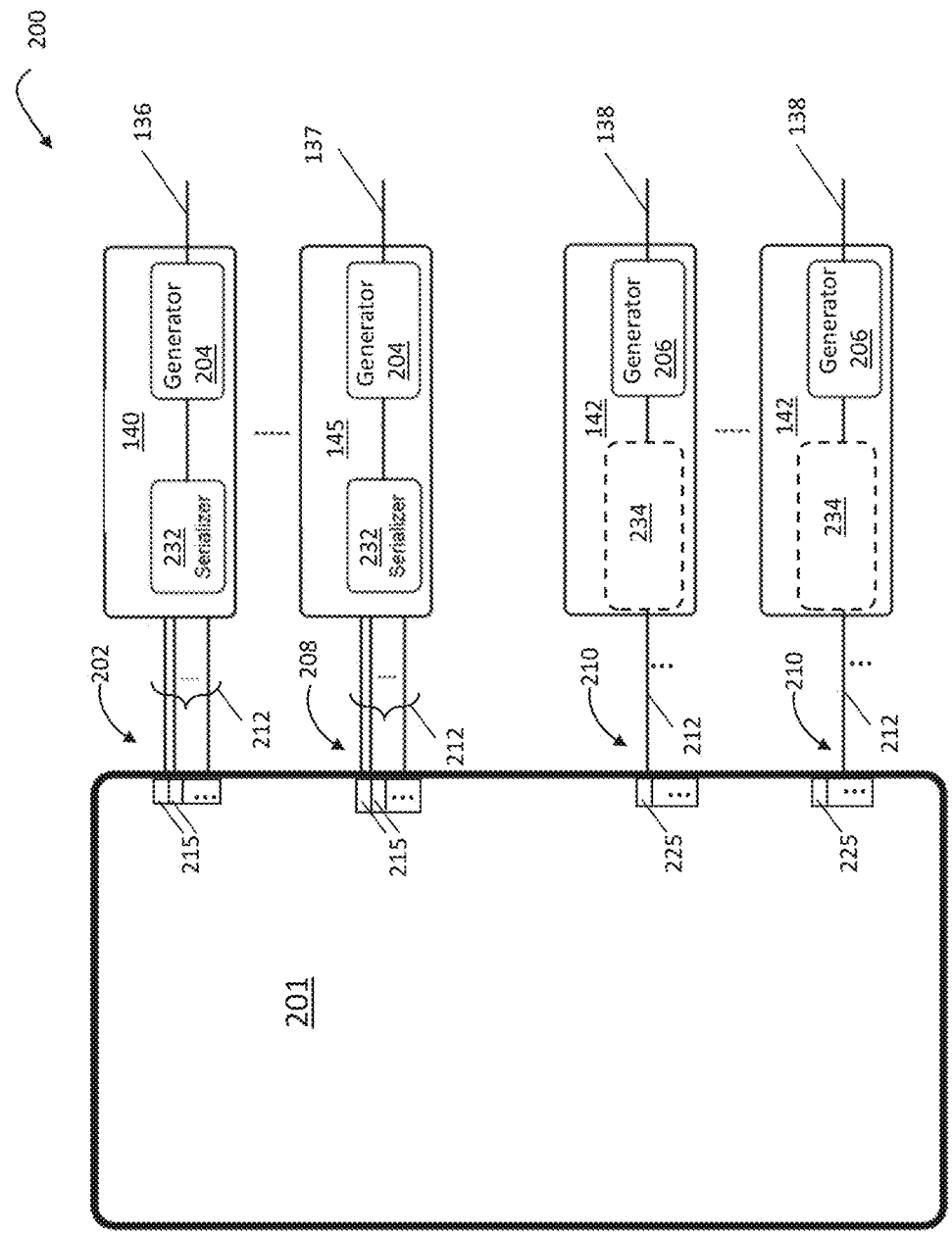
FIG. 2 illustrates a digital to analog converter, according to various aspects of the subject technology.

FIG. 2 illustrates an interface system 200 of a digital to analog converter, according to various aspects of the subject technology. FIG. 2 is similar to FIG. 1 such that the digital input section 201 includes an input port 102, e.g., a DAC input port, the registers 116 and 118, and the interfaces 105 and 106. The DAC cell 140 receives 16 bits via 16 interface links 202 for each bit of the register 116. The DAC cell 145 receives 16 bits via 16 interface links 208 for each bit of the section 118B of the register 118. Thus, the register 116 represents binary bits, which each bit is repeated N times and is encoded by N repeated parallel bits of the same value that are transferred by N interface lines 212 to the DAC cell 140.

As shown in FIG. 2, the interface links 202 and 208 have 3 or more interface lines 212 and the interface link 210 has one or more interface lines 212. In addition, the digital input section 201 includes and shows repeated bits 215, e.g., N repeated input bits, of a single binary bit in the register 116. The repeated bits 215 have the same value as the respective binary bit in the register 116. The repeated bits 215 are the representation of the respective binary bit of the register 116 and may simultaneously be available for the respective binary bit and, thus, the repeated bits 215 may be parallel bits. The digital input section 201 also includes and shows the repeated bits 225 of a single T bit in the section 118B of the register 118. The repeated bits 225 have the same value as the respective T bit in the section 118B. The repeated bits 225 may simultaneously be available as the representation of the respective T bit of the section 118B and, thus, the repeated bits 225 may be parallel bits.

DAC cell 142 receives either 8 bits, 4 bits, 2 bits, or one bit, via 8, 4, 2, or one interface link 210 for each bit of the section 118A of the register 118. As shown, the DAC cells 140 includes a serializer 232 that serializes the 16 bits of the 16 interface lines and converts the serialized 16 bits via a signal-generator 204 into an analog signal 136. The DAC cells 145 also includes the serializer 232 that serializes the 16 bits of the 16 interface lines and converts the serialized 16 bits via the signal-generator 204 into an analog signal 137. The DAC cells 142 further may include a serializer 234 that serializes the 8 bits, 4 bits, 2 bits, or 1 bit of the 8, 4, 2, 1 interface lines of the interface link 210 and converts the serialized 16 bits, e.g., the serialized 16 repeated parallel bits, via a signal-generator 206 into an analog signal 138. In some embodiments, when there is only one interface line, there is no serializer in the DAC cells 142. In some embodiments, one or more interface links 210, e.g., 2 interface links 210, is coupled to one or more DAC cell 142 to generate the analog signals 138.

Figure 3A:
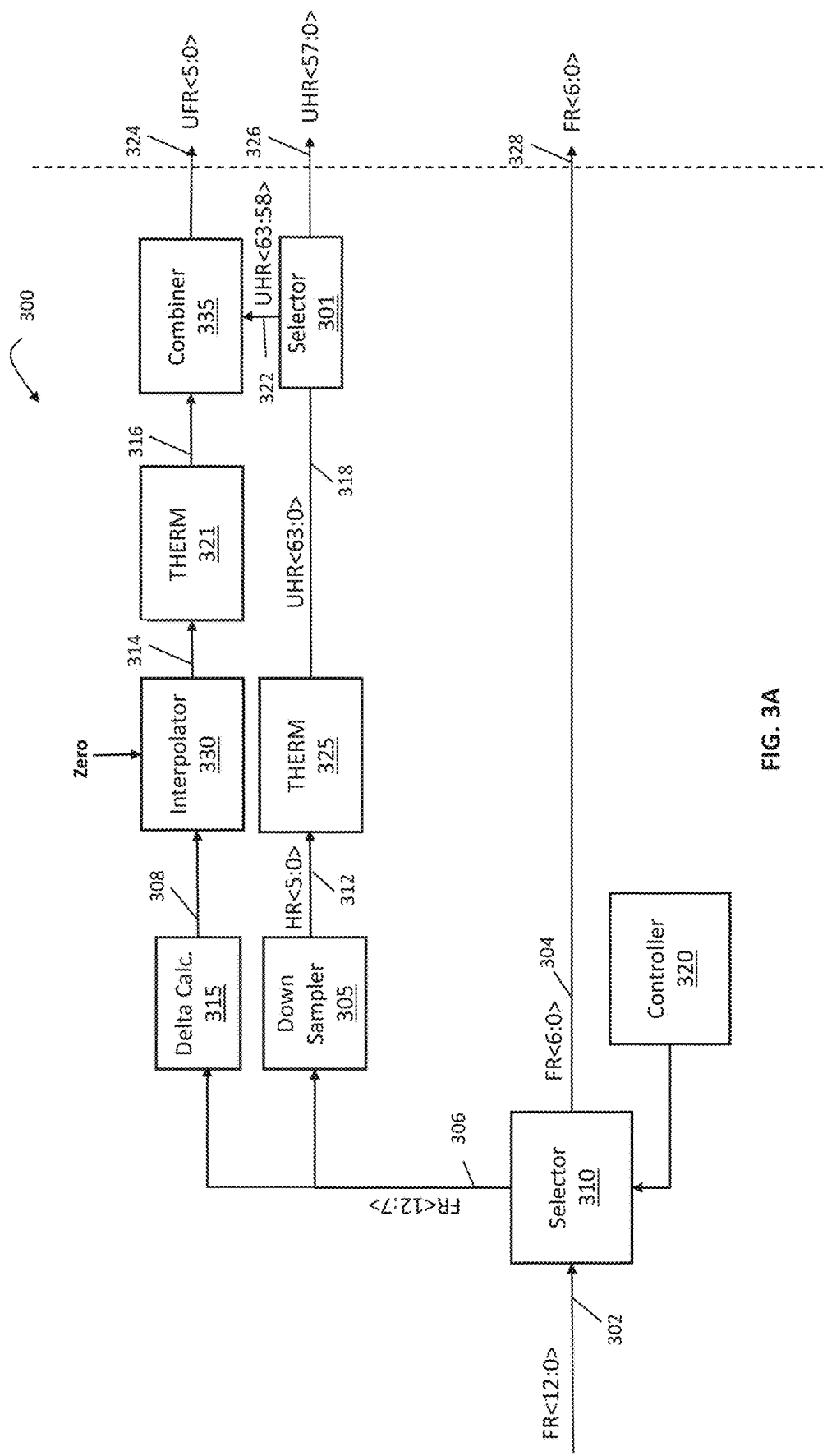
FIGS. 3A and 3B illustrate portions of a digital to analog converter, according to various aspects of the subject technology.
Figure 3B:
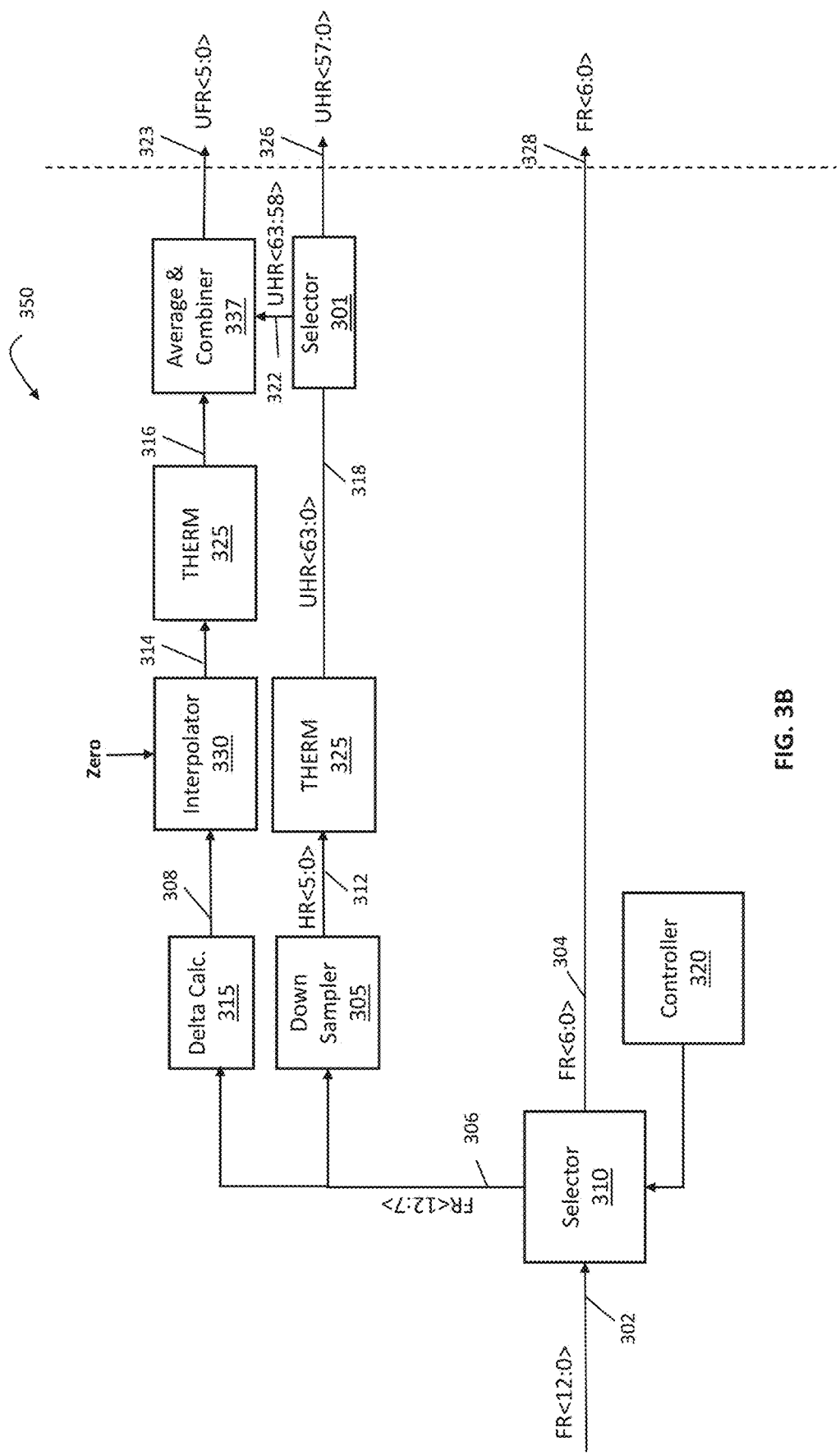

FIGS. 3A and 3B illustrate portions 300 and 350 of a digital to analog converter, according to various aspects of the subject technology. As shown, the 13 bits, e.g., input bits, of the input port 102 is transferred via an interface 302. A first portion, 7 of the LSB are selected by a selector 310 and are transferred via interface 304 as signal 328. In some embodiments, a controller 320 decides the numbers of the binary bits, e.g., the binary coded bits, and the T bits, e.g., the thermometer coded bits, and commands the selector 310 to divide them. As show the 6 MSB from bit number 7 to bit number 12 is directed via an interface 306 to a down sampler 305. The down sampler selects the 6 MSB of every other sample and transfers via an interface 312 to a thermometer coder 325. The thermometer coder 325 generates the 64 T bits. The T bits are transferred via an interface 318 to a selector 301. The selector 301 selects the first 58 bits of the T bits and sends them as a signal 326 that are transferred at half rate, e.g., half of the channel frequency. In some embodiments, by half rate less than full channel frequency is intended. In some embodiments, the selector 301 selects more than or less than 58 bits. In some embodiments, the down sampler 305, down samples the values of the T bits by N over M, where N is 16 and M is either 8, 4, or 2.

The 6 MSB from bit 7 to bit 12 is also directed via an interface 306 to a delta calculator 315, which calculates a difference between values of 6 MSB samples, e.g., difference between sample 1 and sample 2 and puts for the location of sample 1, difference between sample 3 and sample 4 and puts for the location of sample 3, etc. The difference signal is transferred via an interface 308 to an interpolator 330. The interpolator adds a zero in the difference signal such that zeros to locations 2, 4, etc. This generates a zero padded signal that goes through interface 314 to a thermometer coder 321 consistent with the thermometer coder 325 and generates the thermometer code and sends the thermometer code via an interface 316 to a combiner 335, which combines the signal from the thermometer coder 321 and the last 6 bits, the T bits 58 to 63 of the T bits generated by the thermometer coder 325 and received via an interface 322. The combiner 335 generates a signal 324 having 6 bits of the T bits 58 to 63 that between each two points is a thermometer code of the difference. Thus, the signal 324 has 6 last bits of thermometer code generated by thermometer coder 325 with a difference between every two sample (represented in thermometer code) is placed between the T bits 58 to 63.

FIG. 3B is similar to FIG. 3A with the difference that instead of the combiner 335 an average and combiner 337 exists in FIG. 3B. The signal 323 is similar to the signal 324, however, instead of the T bits 58 to 63, there is the thermometer representation of average of the two adjacent samples (e.g., consecutive samples) and between the averages, there is the difference the same as in signal 324.

Figure 4A:
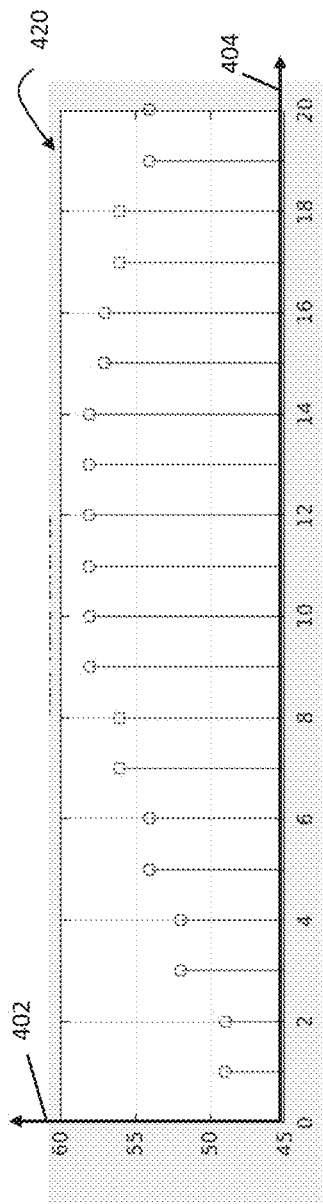
FIGS. 4A, 4B, and 4C illustrate graphs of sampled values, according to various aspects of the subject technology.
Figure 4B:
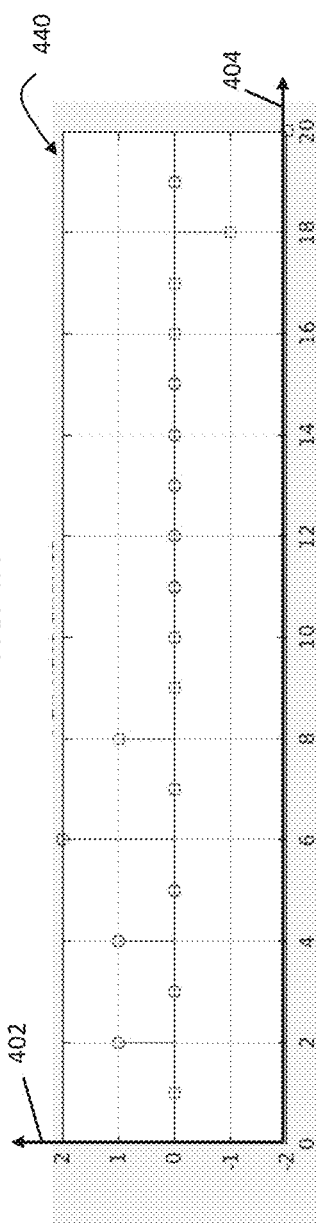
Figure 4C:
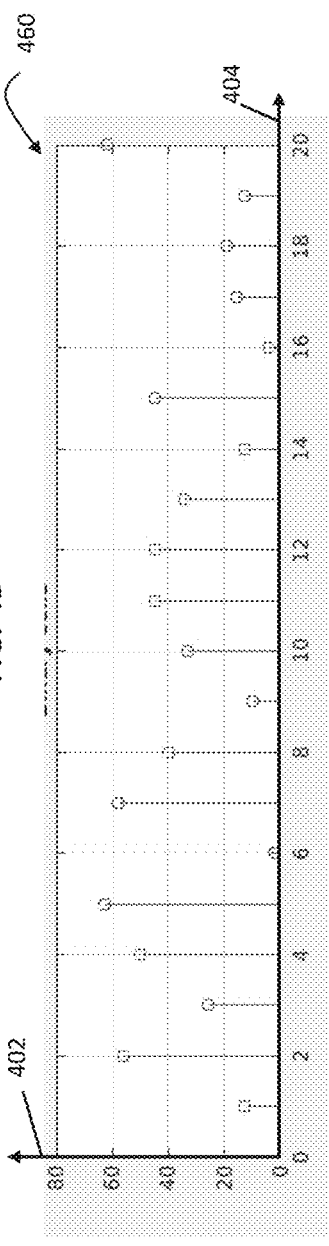

FIGS. 4A, 4B, and 4C illustrate graphs of sampled values, according to various aspects of the subject technology. FIG. 4A shows a graph 420 of the values on coordinate 402 versus the sample points on coordinate 404 of the signal 326 in FIGS. 3A and 3B. As shown in FIGS. 3A and 3B, the signal content can be sent at half rate. Also, as shown in FIG. 4A, every two consecutive values are the same. FIGS. 4B and 4C respectively show graphs 440 and 460 of the values on coordinate 402 versus the sample points on coordinate 404. FIG. 4B show the values of the signal 323 of FIG. 3A with zeros between every two points that makes the signal 323 as a full rate signal. FIG. 4C shows values of the binary bits consistent with signal 328 of FIGS. 3A and 3B and, thus, is a full rate signal.

The subject technology discussed above reduces the number of interface lines in a DAC and saves area on the DAC chip and saves power usage without degrading the produced analog signal.

According to aspects of the subject technology, a system includes a port that receives input bits at a first frequency. The system includes one or more first cells to transmit at a second frequency that is N times greater than the first frequency. The system also includes one or more first interface links that are coupled between a first portion of the input bits and the one or more first cells such that each input bit of the first portion is encoded by N repeated parallel bits with a value of a respective input bit and each first interface link includes N parallel interface lines between the N repeated parallel bits of each input bit of the first portion and each first cell. The system further includes one or more second cells to transmit at a third frequency that is M times greater than the first frequency, and one or more second interface links that are coupled between a second portion of the input bits and the one or more second cells. The second portion of the input bits is encoded by thermometer coded T bits such that each one of the T bits is encoded by M repeated parallel bits, and each second interface link includes M parallel interface lines between the M repeated parallel bits of each T bit and each second cell and M is less than N and greater or equal to one. M is selected to reduce a number of interface lines per bit for the second portion of the input bits compared to the first portion of the input bits.

In an aspect of the subject technology, N equals to 16, the first portion of the input bits is binary coded such that each bit is encoded by 16 repeated parallel bits such that each first interface link is coupled between the 16 repeated parallel bits and each first cell. In an aspect of the subject technology, the input bits include 13 bits, the first portion includes 7 bits, and the second portion includes 6 bits. In an aspect of the subject technology, the thermometer coded T bits at most includes one transition between the T bits, and the second portion includes 6 bits and the thermometer coded T bits are 64. In an aspect of the subject technology, each first cell includes a serializer to serialize N repeated parallel bits. In an aspect of the subject technology, each first cell includes a signal-generator that generates an analog signal from the serialized N repeated parallel bits at the second frequency. In an aspect of the subject technology, the first portion includes least significant input bits, and the second portion includes most significant input bits of the port.

According to aspects of the subject technology, a system includes a port that includes a number of input bits and the port receives the input bits at a first frequency and one or more first cells for generating a signal for a channel with a channel frequency that is N times greater than the first frequency and the second frequency is smaller than the channel frequency. The one or more first cells transmit at a second frequency that is M times greater than the first frequency and the second frequency is smaller than the channel frequency. The system also includes one or more first interface links coupled between a first portion of the input bits of the port and the one or more first cells. The first portion of the input bits is represented by a thermometer coded T bits such that each one of the T bits is represented by M repeated parallel bits. Each first interface link includes M parallel interface lines between each T bit and each first cell and M is determined as a fraction of N to reduce the number of interface line for the T bits.

In an aspect of the subject technology, the first frequency is 1 GHz, the channel frequency is 16 GHz, and the second frequency is between either 4 GHz or 8 GHz, and each first interface link includes either 4 or 8 interface lines. In an aspect of the subject technology, the system further includes one or more second cells to transmit at the channel frequency and one or more second interface links coupled between two or more bits of the input bits of the port, and each bit of the two or more bits is a binary coded bit and is represented by N repeated parallel bits and each second interface link includes N parallel interface lines between the N repeated parallel bits of each thermometer coded bit and each second cell. In an aspect of the subject technology, the input bits includes 13 bits, the first portion includes 5 bits, and the two or more bits includes 8 bits. In an aspect of the subject technology, each first cell includes a signal-generator to generate an analog signal from a serialized M parallel bits at the second frequency. In an aspect of the subject technology, the first portion includes most significant bits. In an aspect of the subject technology, T equals 64 and M equals one.

According to aspects of the subject technology, a system includes a port including a first binary coded bit and a second thermometer coded bit. The port receives the first binary coded bit and the second thermometer coded bit at a first frequency. The system also includes a first cell to transmit at a second frequency that is N times greater than the first frequency and N is an integer larger than one. The system also includes a first interface link coupled between the first binary coded bit and the first cell. The first binary coded bit is represented by N repeated parallel bits and the first interface link includes N parallel interface lines between the first binary coded bit and the first cell. A second cell to transmits at a third frequency that is M times greater than the first frequency and M is an integer larger or equal to one. The system also includes a second interface link coupled between the second thermometer coded bit and the second cell and the second thermometer coded bit is represented by thermometer coded T bits such that each one of the T bits is represented by M repeated parallel bits. The second interface link includes M parallel interface lines between the M repeated parallel bits and the second cell and M is a fraction of N to reduce an area used by the second interface link compared to the first interface link.

In an aspect of the subject technology, the system further includes two or more thermometer coded bits including the second thermometer coded bit. A number of T bits is 2 to a power of a total number of thermometer coded bits. In an aspect of the subject technology, values of the T bits are down sampled by N over M. In an aspect of the subject technology, the system further includes two or more binary coded bits including the first binary coded bit. A total number of binary coded bits and thermometer coded bits is 13. In an aspect of the subject technology, N is 16 and M is 2, and the system receives the two or more binary coded bits and the two or more thermometer coded bits at 1 GHz. The binary coded bits are transmitted at 16 GHz and the thermometer coded bits are transmitted at 2 GHz. In an aspect of the subject technology, the two or more binary coded bits are transmitted at a channel frequency and the T bits are transmitted at N over M times lower than the channel frequency. For the T bits, N over M times fewer interface lines is used and N over M times less power and area is used compared to the two or more binary coded bits.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or more aspects," "an implementation," "the implementation," "another implementation," "some implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system, comprising:
   a port configured to receive input bits at a first frequency;
   one or more first cells configured to transmit at a second frequency that is N times greater than the first frequency;
   one or more first interface links coupled between a first portion of the input bits and the one or more first cells, wherein each input bit of the first portion is encoded by N repeated parallel bits with a value of a respective input bit and each first interface link comprises N parallel interface lines between the N repeated parallel bits of each input bit of the first portion and each first cell;
   one or more second cells configured to transmit at a third frequency that is M times greater than the first frequency; and
   one or more second interface links coupled between a second portion of the input bits and the one or more second cells, wherein the second portion of the input bits is encoded by thermometer coded T bits, wherein each one of the T bits is encoded by M repeated parallel bits, and wherein each second interface link comprises M parallel interface lines between the M repeated parallel bits of each T bit and each second cell, wherein M is less than N and greater or equal to one, to reduce a number of interface lines per bit for the second portion of the input bits compared to the first portion of the input bits.

2. The system of claim 1, wherein N is equal to 16, wherein the first portion of the input bits is binary coded such that each bit is encoded by 16 repeated parallel bits, wherein each first interface link is coupled between the 16 repeated parallel bits and each first cell.

3. The system of claim 1, wherein the input bits comprises 13 bits, the first portion comprises 7 bits, and the second portion comprises 6 bits.

4. The system of claim 1, wherein the thermometer coded T bits at most comprises one transition between the T bits, and wherein the second portion comprises 6 bits and the thermometer coded T bits are 64.

5. The system of claim 1, wherein each first cell comprises a serializer configured to serialize N repeated parallel bits.

6. The system of claim 5, wherein each first cell comprises a signal-generator configured to generate an analog signal from the serialized N repeated parallel bits at the second frequency.

7. The system of claim 1, wherein the first portion comprises least significant input bits of the port, and the second portion comprises most significant input bits of the port.

8. A system, comprising:
a port comprising a number of input bits, wherein the port is configured to receive the input bits at a first frequency;
one or more first cells configured to generate a signal for a channel at a channel frequency that is N times greater than the first frequency, wherein N is larger than one, wherein the one or more first cells are configured to transmit at a second frequency that is M times greater than the first frequency and the second frequency is smaller than the channel frequency; and
one or more first interface links coupled between a first portion of the input bits of the port and the one or more first cells, wherein the first portion of the input bits is encoded by thermometer coded T bits, wherein each one of the T bits is encoded by M repeated parallel bits with a value of a respective T bit, wherein each first interface link comprises M interface lines between each T bit and each first cell, and wherein M is smaller than N to reduce the number of interface lines for the T bits.

9. The system of claim 8, wherein the first frequency is 1 GHz, the channel frequency is 16 GHz, and the second frequency is either 4 GHz or 8 GHz, and wherein each first interface link comprises either 4 or 8 interface lines.

10. The system of claim 8, further comprising:
one or more second cells configured to transmit at the channel frequency; and
one or more second interface links coupled between two or more bits of the input bits of the port and the one or more second cells, wherein each bit of the two or more bits is a binary coded bit and is encoded by N repeated parallel bits with a value of a respective input bit and each second interface link comprises N interface lines between the N repeated parallel bits of each binary coded bit and each second cell.

11. The system of claim 10, wherein the input bits comprises 13 bits, the first portion comprises 5 bits, and the two or more bits comprises 8 bits.

12. The system of claim 8, wherein each first cell comprises a signal-generator configured to generate an analog signal from a serialized M parallel bits at the second frequency.

13. The system of claim 8, wherein the first portion comprises most significant bits of the input bits.

14. The system of claim 8, wherein T equals 64 and M equals one.

15. A system, comprising:
a port comprising a first binary coded bit and a second thermometer coded bit, wherein the port is configured to receive the first binary coded bit and the second thermometer coded bit at a first frequency;
a first cell configured to transmit at a second frequency that is N times greater than the first frequency, wherein N is greater than one;
a first interface link coupled between the first binary coded bit and the first cell, wherein the first binary coded bit is encoded by N repeated parallel bits with a value of a respective input bit and the first interface link comprises N interface lines between the first binary coded bit and the first cell;
a second cell configured to transmit at a third frequency that is M times greater than the first frequency, wherein M is larger or equal to one; and
a second interface link coupled between the second thermometer coded bit and the second cell, wherein the second thermometer coded bit is encoded by thermometer coded T bits, wherein each one of the T bits is encoded by M repeated parallel bits with a value of the second thermometer coded bit, wherein the second interface link comprises M interface lines between the M repeated parallel bits and the second cell, and wherein M is smaller than N to reduce an area used by the second interface link compared to the first interface link.

16. The system of claim 15, further comprising:
two or more thermometer coded bits including the second thermometer coded bit, wherein a number of T bits is 2 to a power of a total number of thermometer coded bits.

17. The system of claim 16, wherein values of the T bits are down sampled by N over M.

18. The system of claim 16, further comprising:
two or more binary coded bits including the first binary coded bit, wherein a total number of binary coded bits and thermometer coded bits is 13.

19. The system of claim 18, wherein N is 16 and M is 2, and wherein the system receives the two or more binary coded bits and the two or more thermometer coded bits at 1 GHz, the binary coded bits are transmitted at 16 GHz, and the thermometer coded bits are transmitted at 2 GHz.

20. The system of claim 18, wherein the two or more binary coded bits are transmitted at a channel frequency and the T bits are transmitted at N over M times lower than the channel frequency, and wherein for the T bits, N over M times fewer interface lines is used and N over M times less power and area is used compared to the two or more binary coded bits.

* * * * *